United States Patent [19]

Ormond et al.

[11] Patent Number: 5,128,282
[45] Date of Patent: Jul. 7, 1992

[54] PROCESS FOR SEPARATING IMAGE SENSOR DIES AND THE LIKE FROM A WAFER THAT MINIMIZES SILICON WASTE

[75] Inventors: Brian T. Ormond; Kraig A. Quinn, both of Webster; Paul A. Hosier; Josef E. Jedlicka, both of Rochester, all of N.Y.

[73] Assignee: Xerox Corporation, Stamford, Conn.

[21] Appl. No.: 787,445

[22] Filed: Nov. 4, 1991

[51] Int. Cl.$^5$ .................. H01L 21/302; H01L 21/304
[52] U.S. Cl. ..................................... 437/226; 437/227
[58] Field of Search ........................... 437/226, 227; 148/DIG. 28; 204/225; 225/2; 118/915, 919

[56] References Cited

U.S. PATENT DOCUMENTS

| | | | |
|---|---|---|---|
| 4,604,161 | 8/1986 | Araghi | 156/645 |
| 4,814,296 | 3/1989 | Jedlicka et al. | 437/226 |
| 4,925,808 | 5/1990 | Richardson | 437/227 |
| 5,000,811 | 3/1991 | Campanelli | 437/226 |

FOREIGN PATENT DOCUMENTS

| | | | |
|---|---|---|---|
| 2332822 | 1/1975 | Fed. Rep. of Germany | 437/227 |
| 2095897A | 11/1982 | United Kingdom | 437/227 |

Primary Examiner—Olik Chaudhuri
Assistant Examiner—Loc Q. Trinh
Attorney, Agent, or Firm—Frederick E. McMullen

[57] ABSTRACT

A process for separating image sensor dies and the like from a wafer in which pairs of separation grooves separating each row of dies are formed in the active side of the wafer, with the tab between each groove pair being substantially equal to the width of the dicing blade, cutting a single bottom groove in the inactive side of the wafer opposite to and spanning each pair of separation grooves, and aligning the dicing blade with the midpoint of the wall of one groove in each pair of grooves so as to cut between the rows of dies. In a second embodiment, a two-pass separation process is enabled in which the tab between separation grooves is slightly larger than the width of the dicing blade, with the dicing blade first aligned with the midpoint of one separation groove to cut one row of dies from the wafer together with part of the tab, with the blade realigned with the midpoint of the other separate groove to cut a second row of dies and the remainder of the tab.

5 Claims, 4 Drawing Sheets

PROCESS FOR SEPARATING IMAGE SENSOR DIES AND THE LIKE FROM A WAFER THAT MINIMIZES SILICON WASTE

The invention relates to a process of separating image sensor dies from a larger wafer to provide dies with precision ends enabling the dies to be abutted with other dies to form a longer array, and more particularly, to an improved process of separating image sensor dies in which the amount of silicon destroyed during separation is substantially reduced.

Image sensor dies for scanning document images, such as Charge Coupled Devices (CCDs), typically have a row or linear array of photosites together with suitable supporting circuitry integrated onto silicon. Usually, a die of this type is used to scan line by line across the width of a document with the document being moved or stepped lengthwise in synchronism therewith.

In the above application, the image resolution is proportional to the ratio of the scan width and the number of array photosites. Because of The difficulty in economically designing and fabricating long dies, image resolution for the typical die commercially available today is relatively low when the die is used to scan a full line. While resolution may be improved electronically as by interpolating extra image signals, or by interlacing several smaller dies with one another in a non-colinear fashion so as to cross over from one die to the next as scanning along the line progresses, electronic manipulations of this type adds to both the complexity and the cost of th system. Further, single or multiple die combinations such as described above usually require more complex and expensive optical systems.

Because of this, along or full width array of image sensor dies having a length equal to or larger than the document line and with a large packing of co-linear photosites to assure high resolution would be desirable. One way to make such arrays would be to abut several smaller image sensor dies together end-to-end. However, in order to do this, the photosites must extend to the border or edge of the die to assure continuity and the die ends themselves must be precise if faults and artifacts at the die junctions are to be avoided.

While the standard technique of scribing and cleaving silicon wafers used by the semiconductor industry for many years can produce dies having reasonably controlled dimensions, the micorscopic damage occurring to the die surface during the scribing operation has effectively prevented locating the photosites within the required proximity to the die end. This is because the top surface of silicon wafers is virtually always parallel to the <100> plane of the crystalline lattice so that, when a wafer of this type is cut or diced with a high speed diamond blade, chips and slivers are broken away from the top surface of the wafer in the direct vicinity of the channel created by the blade. This surface chipping may extend to about 50 μm, thus rendering it impossible for active elements of the die to be located any closer than about 50 μm from the dicing channel. As result, long linear arrays made up of individual dies assembled together end to end have only been possible for low resolution devices, i.e., those having a spatial frequency of 5 lines per mm or less.

In the prior art, an earlier patent by Mehdi N. Araghi, U.S. Pat. No. 4,406,161, assigned to the same assignee as the present invention, addressed this problem. Araghi disclosed the concept of chemically etching a V-shaped groove in the surface of a wafer followed by a partial cut in the back of the wafer forming an inside groove directly underneath the V-shaped groove.. This allowed the dies to be separated from one another by means of a mechanical cleaving or breaking operation. In this approach, the cut through the top surface of the wafer, in which the active elements are built, was not made with an abrasive blade but by means of the chemically etched V-shaped groove. As a result, the propagation of mechanicla damage along the top surface of the wafer was avoided, allowing active elements to be placed as close to the V-shaped groove as the accuracy of th photolithography and the etching operation would allow.

However, the Araghi technique left at least one face of the cleaved chip with a protruding knife edge defined by two intersecting <111> planes. This knife edge was delicate and hence easily damaged during fabrication and instaqllation, leading to high rejection rates, reduced yields, and increased cost.

U.S. Pat. No. 4,814,296 issued in the names of Josef E. Jedlicka et al, entitled "Method of Fabricating Image Sensor Dies for Use in Assembling Arrays", and assigned to the same assignee as the present invention, describes a technique for fabricating sensor dies in which pairs of V-shaped grooves delineating the chip ends are etched into a silicon wafer. A dicing saw blade is positioned so that the side of the blade facing the die is aligned with the bottom of the V-shaped groove and the cut made. This process retains intact on one side of the V-shaped groove to intercept and prevent cracks and chipping caused by sawing from damaging the die active surface and any circuits thereon.

This process, however, results in a tab section or region between each pair of V-shaped grooves. The tab section must be relatively large in order to enable the tab section to be securely locked in place by an adhesive applied to the inactive side of the wafer during separation that prevents the wafer including the tab from moving or lifting during the separation process. Since the tab section is destroyed or thrown away following the separation process, a substantial amount of valuable silicon is lost as a result.

The present invention seeks to address and rectify the above by providing an improved process for separating rows of sensor dies on a common wafer using a dicing blade to provide uniform, smooth die ends allowing the dies to be abutted at the ends to form a longer sensor array while reducing the amount of silicon lost during the separation process, the wafer having an active surface with sensor circuitry and an opposite inactive surface, comprising the steps of: forming paris of parallel grooves in the active surface of the wafer between each of the rows of dies bordering the ends of the dies in the rows with the groove pairs being spaced apart by a distance at least equal to the cutting width of the blade to create a relatively small throwaway tab of silicon material therebetween; forming a single groove in the opposite surface of the wafer opposite to each of the groove pairs having a width slightly greater than the distance between the groove pairs; locating the blade and wafer relative to one another at one of the groove pairs with at least one edge of the blade aligned with substantially the midpoint of the wall of one of the grooves of th groove pairs that borders the die ends of one of the rows; sawing the wafer through the tab with the blade to at least provide the precision die ends for the one row of dies; where the cutting width of the blade is less than the distance between groove pairs, locating the blade and wafer relative to one another so that the opposite edge of the blade is aligned with substantially the midpoint of the wall of the other groove of the one groove pair that borders the die ends of the next row of dies; sawing the wafer through the remaining part of the tab with the blade to provide the precision die ends for the next row of dies; and repeating the above steps for the remaining ones of the groove pairs.

DETAILED DESCRIPTION OF THE INVENTION

Figure 1:
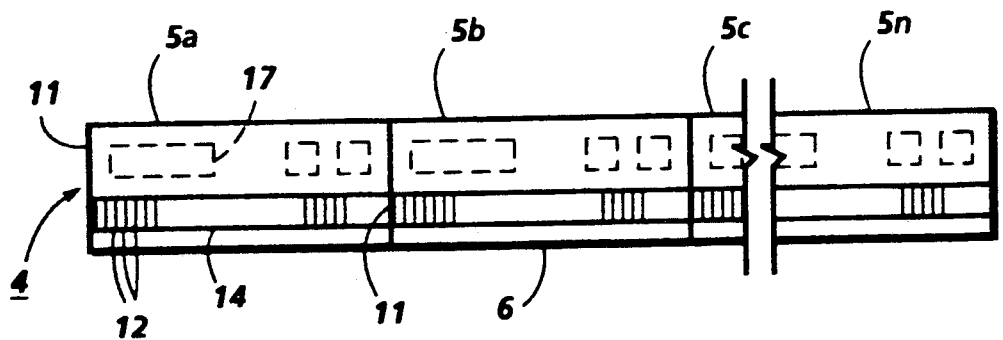
FIG. 1 is a top view illustrating a long array composed of image sensor dies fabricated in accordance with the teaching of this invention assembled together.
Figure 2:
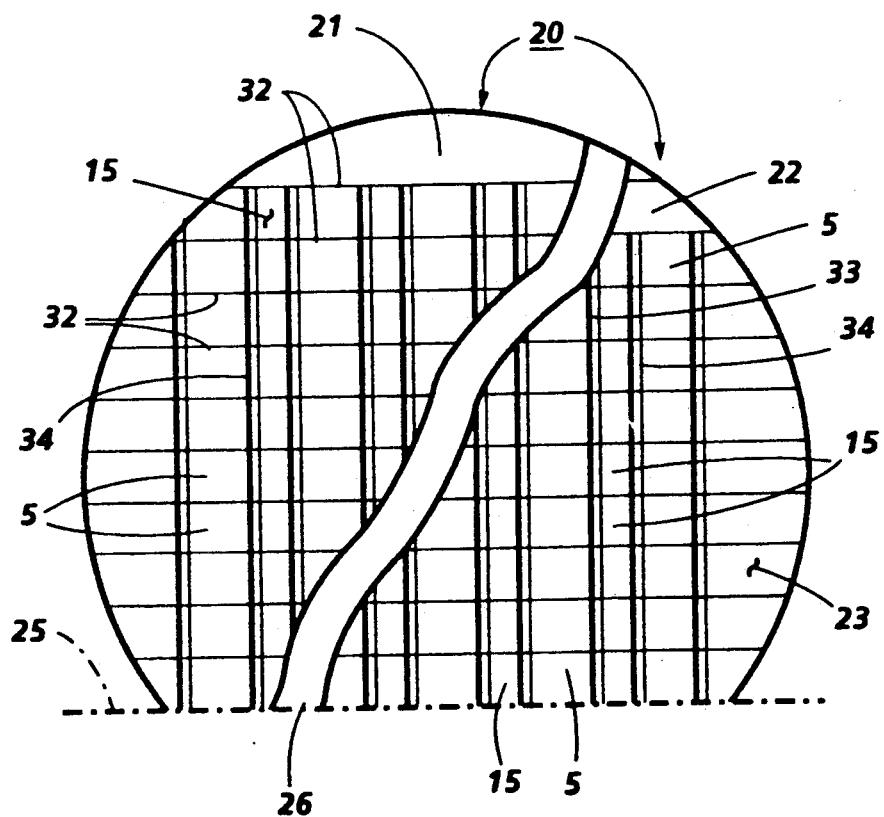
FIG. 2 is a top view of a silicon wafer prior to cutting individual dies therefrom.

Refering particularly to FIGS. 1 and 2 of the drawings, and the aforementioned Jedlicka et al U.S. Pat. No. 4,814,296, there is disclosed a long or full lwidth scanning array 4 composed of a plurality of smaller sensor dies 5 assembled together end to end (depicted by numerals 5a, 5b, ... 5n in FIG. 1 of the drawings). As will be understood by those skilled in the art, array 4 is typically used to read or scan a document original line by line and convert the document image to electrical signals. Preferably, array 4 is a full length array having an overall length equal to or slightly greater than the width of the largest document to b scanned. Dies 5 are fabricated so that row 14 of photosites 12 of each die extends adjacent the edges or ends of the die so that when dies 5 are assembled together, there is formed a continuous and uninterrupted row of photosites with a substantially uniform periodicity on array 4.

Typically, dies 5 are made of relatively thin silicon and have a generally rectangular shape, with the axis of row 14 of photosites paralleling th elongitudinal axis of the dies. While a single row 14 of photosites 12 is shown, plural photosite rows may be contemplated. Other active elements such as shift registers, gates, pixel clock, etc. (designated generally by the numeral 17 herein), are preferably formed integral with die5. Suitable external connectors (not shown) are provided for electrically coupling the dies 5 to related external circuitry.

Dies 5 are fabricated from a relatively large wafer 20 of <100> silicon of the type commonly employed to make integrated circuits. Normally, wafer 20 has a plurality of dies 5 previously fabricated thereon in vertical and horizontal rows 21, 22 respectively by integrated circuit forming techniques.

Figure 3:
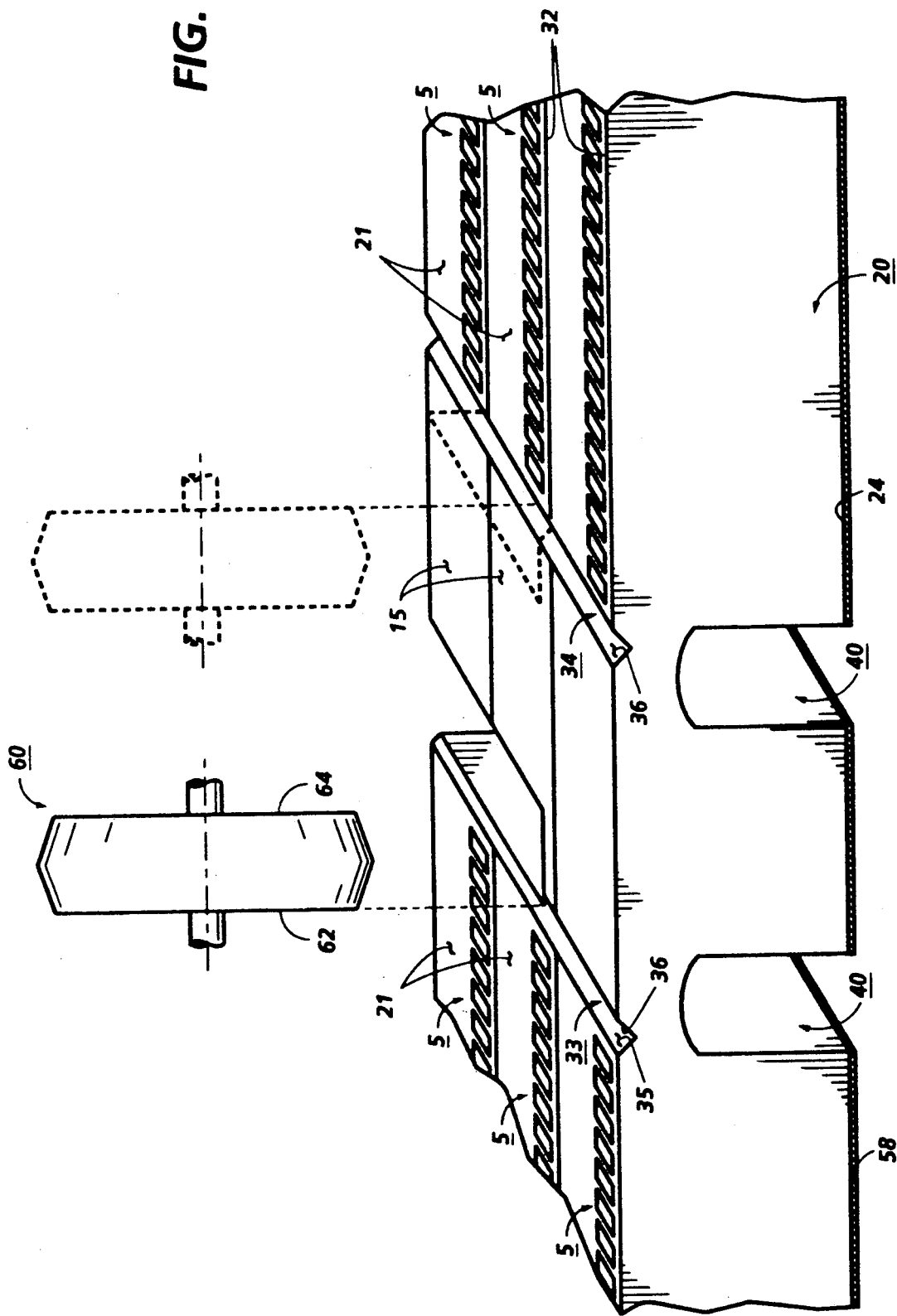
FIG. 3 is an enlarged isometric view with parts broken away depicting a prior art two-pass separation process for separating image sensor dies from a silicon wafer by cutting along the bottom of V-shaped separation grooves formed in the active surface of the wafer and matching bottom grooves cut in the inactive side of the wafer, the separation grooves being widely spaced apart to create a tab therebetween with a relatively large surface area enabling the tab to be securely held in place during the separation process.

Referring also to FIG. 3, the die ends are delineated for separation by pairs of spaced, parallel, V-shaped separation grooves 33, 34 formed in top the active surface 23 of wafer 20 between each vertical row 21 of dies 5. Grooves 33, 34 may be formed, for example, by means of standard photolithographic techniques and anisotropic etchants such as Ethylenediamine/-Pyrocatechol/H$_2$O solution (EDA). Other processes for forming grooves 33, 34 in the exact location and size desired may be contemplated such as plasma etching, reactive ion etching, etc. As will be understood by those skilled in the art, a flat 26 is normally present on industrial wafers, which is aligned within a fraction of a degree to the (110) crystalline axis 25. This flat makes it possible for separation grooves 33, 34 to be accurately aligned with the (110) crystalline orientation of the wafer, typically within one degree.

Grooves 33, 34 have intersecting walls or sides 35, the walls 35, 36 being parallel to the <111> crystalline planes. Grooves 33, 34 delineate the short sides or "ends" 11 of the dies 5, each pair of grooves 33, 34 defining therebetween a bridge section, referred to herein as a tab 15, between adjoining die pairs. Additional reference patterns such as lines 32 are placed on the surface of the wafer during processing to define the long sides 6 of the dies 5.

A second groove 40 is formed as be sawing in the bottom or inactive surface 24 of wafer 20 opposite each groove 33, 34, grooves 40 being parallel to and largert than the V-shaped grooves 33, 34 opposite thereto.

To separate the dies 5 on wafer 20, a high speed diamond dicing blade 60 is used. A suitable wafer mounting adhesive 58 on the inactive surface 24 of the wafer retains the wafer securely in position opposite blade 60 during dicing, wafer 20 being positioned so that one edge 62 of blade 60 is substantially aligned with the bottom of the V-shaped groove, for example groove 33, where the cut is to be made. A first cut is made to separate the row of dies 5 bordering the wall 35 of groove 33 following which blade 60 is repositioned so that edge 64 of blade 60 aligns with the bottom of the other groove 34 where the cut is to be made. The dicing process is repeated to separate the row of dies 5 adjoining the wall 35 of V-shaped groove 34 from tab 15. The portion of tab 15 removed is discarded.

As will be understood, it is desirable, in addition to achieving an accurate cut without chipping or fragmenting, to reduce the amount of silicon lost during the dicing process. One way of doing this is to reduce the size of the tabs 15 between dies. However, in attempting to reduce tab size, it was discovered that there is a minimum tab width of approximately 800 μm that had to be maintained. If tabs 15 were less than this minimum size, there is insufficient tab surface for the adhesive 58 to hold the tabs in place during dicing.. The resulting movement of the tab was found to cause damage to the active area of the dies during the dicing process.

Figure 4:
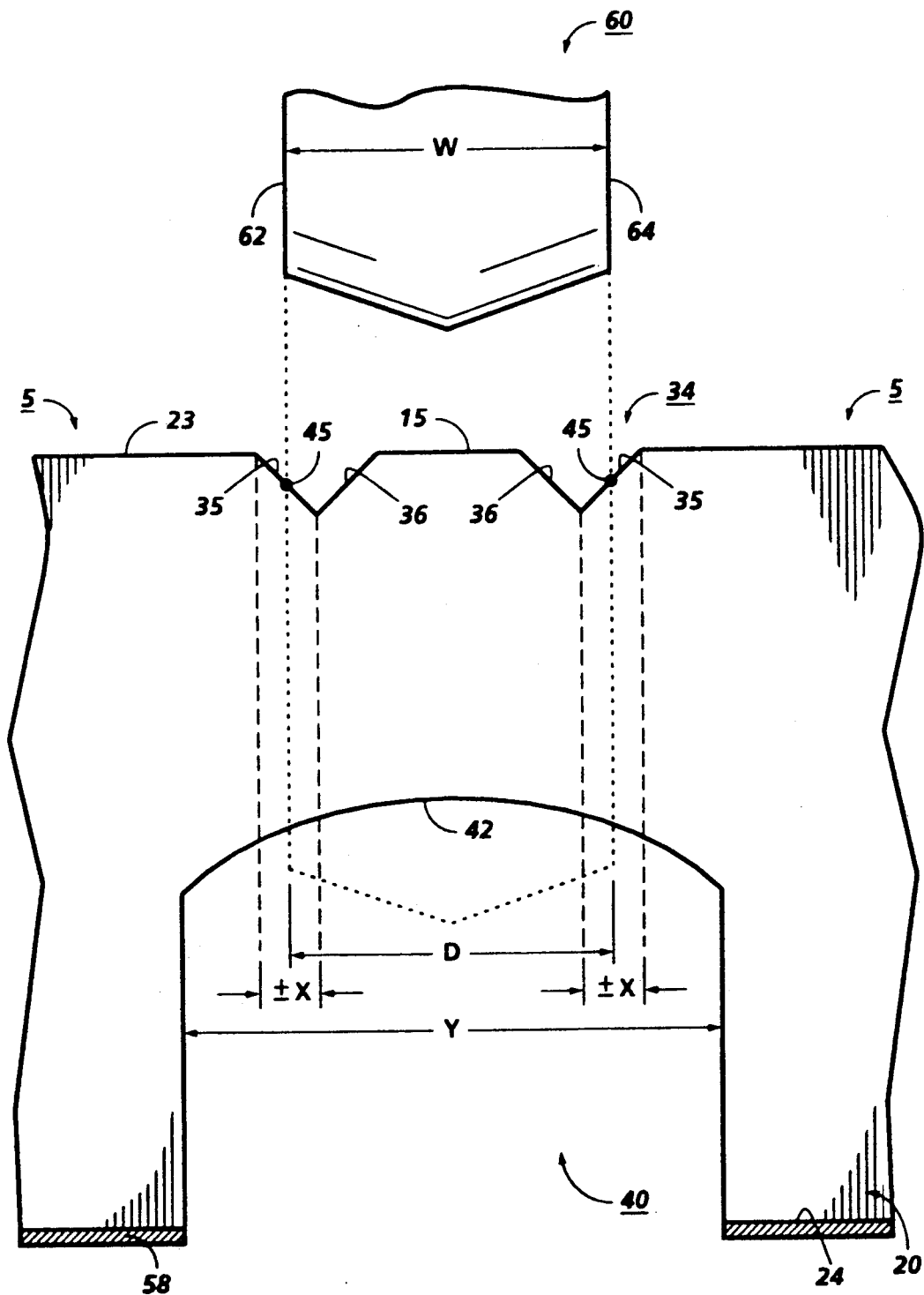
FIG. 4 is an enlarged side view in cross section depicting the improved single pass separation process of the present invention in which the tab formed between separation grooves is substantially equal to the width of the dicing blade with a single bottom groove spanning the width of the tab provided in the inactive side of the wafer so that the amount of silicon destroyed during the separation process is substantially reduced.

As explained more fully in copending U.S. patent application Ser. No. 07/787,444 filed on Nov. 4, 1991, in the names of Kraig A.kk Quinn et al, and entitle "Method of Fabricating Image Sensors Dies and the Like for Use in Assembling Arrays", the subject matter of which is incorporated by reference herein, it has been found advantageous to provide a relatively large area within which the separation cut can be made to reduce the criticality in positioning dicing blade 60. To accomplish this, grooves 33, 34 are made relatively large, with a width of about 10 $\mu$m to provide the wall 35 of grooves 33, 34 adjoining the dies with a relatively large surface area. For dicing, the edge of dicing blade 60 is aligned with substantially the midpoint 45 of wall 35 as shown in FIG. 4. As a result, cracks, chipping, etc. from the sawing action of blade 60 are concentrated at and intercepted by the part of the wall 35 remaining in each groove 33, 34 after the cut. This avoids damage to the active surface 23 of the dies and any circuits 17 thereon. At the same time, criticality in the alingnment of blade 60 with grooves 33, 34 is reduced.

Referring now to FIG. 4, to reduce the amount of silicon lost during the dicing process while providing precision edges 11 devoid of chipping and fragmenting enabling the dies 5 to be abutted together end-to-end, grooves 33, 34 are located so that the distance E separating the points 45 on walls 35 of grooves 33, 34 where the cuts to be made is substantially equal to the width W of dicing blade 60. In this example, the width of the blade is assumed to be 72 $\mu$m. By making the distance D between cutting points 45 equal to W, the width of tabs 15 becomes equal to distance D. This reduction in tab size substantially reduces the amount of silicon lost during the dicing process. In the example discussed where dicing blade 60 has a width W of 72 $\mu$m, the reduction in tab width that is achieved is approximately 676 $\mu$m (i.e., 800 $\mu$m-72 $\mu$m).

A single groove 40 is formed in the bottom or inactive surface 24 of wafer 20 for each pair of grooves 33, 34 opposite tab 15. Groove 40 spans the width of the tab 15, groove 40 having a width Y somewhat greater than the width E of tabs 15.. As a result, grooves 40 extend on each side to a point past the outside border of the groove pair that defines each section 15. This extra distance enables a margin ($\pm$X) substantially equal to the effective width of wall 35 to be provided for use when aligning dicing blade 60 with the grooves. Grooves 40 have a depth such that base 42 of grooves 40 is spaced sufficiently far from any photosites 12 or active circuits 177 on the adjoining dies 5 to prevent interference therewith. Grooves 40 may, following forming, be etched in EDA or another suitable anisotropic etchant to remove any stresses resulting from formation thereof.

During dicing, the wafer is locked in position opposite dicing blade 60 through contact of wafer mounting adhesive 58 with a support (not shown), wafer 20 being positioned so that blade 60 is opposite to and above the groove pair 33, 34 to be cut with the plane of blade 60 parallel with the longitudinal axis of grooves 33, 34. One side of blade 60, i.e., side 62, is aligned with the point 45 on one wall 35 of separation groove 33 or 34 where the cut is to be made. Since the width W of blade 60 is equal to the distance D separating the cutting points 45 on the walls 35 of grooves 33, 34, the opposite side of blade 60, i.e., side 64, is automatically aligned as well.

Since the width W of blade 60 spans the distance between groove pair 33, 34 the tab 15 between dies 5 including part of the walls 35 of each groove 33, 34 is destroyed during the sawing process. Blade 60 cuts through wafer 20 to groove 40 in the inactive side 24 of wafer 20, separating the pairs of dies 5 previously joined by tab 15 to provide a precision edge 11 at the end of each die suitable for joining the dies in abutting end-to-end relation.

The aforedescribed operation is repeated in each pair of grooves 33, 34 of wafer 20, after which the dies are separated from one another by cutting along lines 32. As a result, each end 11 of the dies is formed with a uniformlly flkat and smooth precision edge 11 that precisely defines the die ends and enables dies 5 to be assembled with other dies end to end to form a long array 4.

Figure 5:
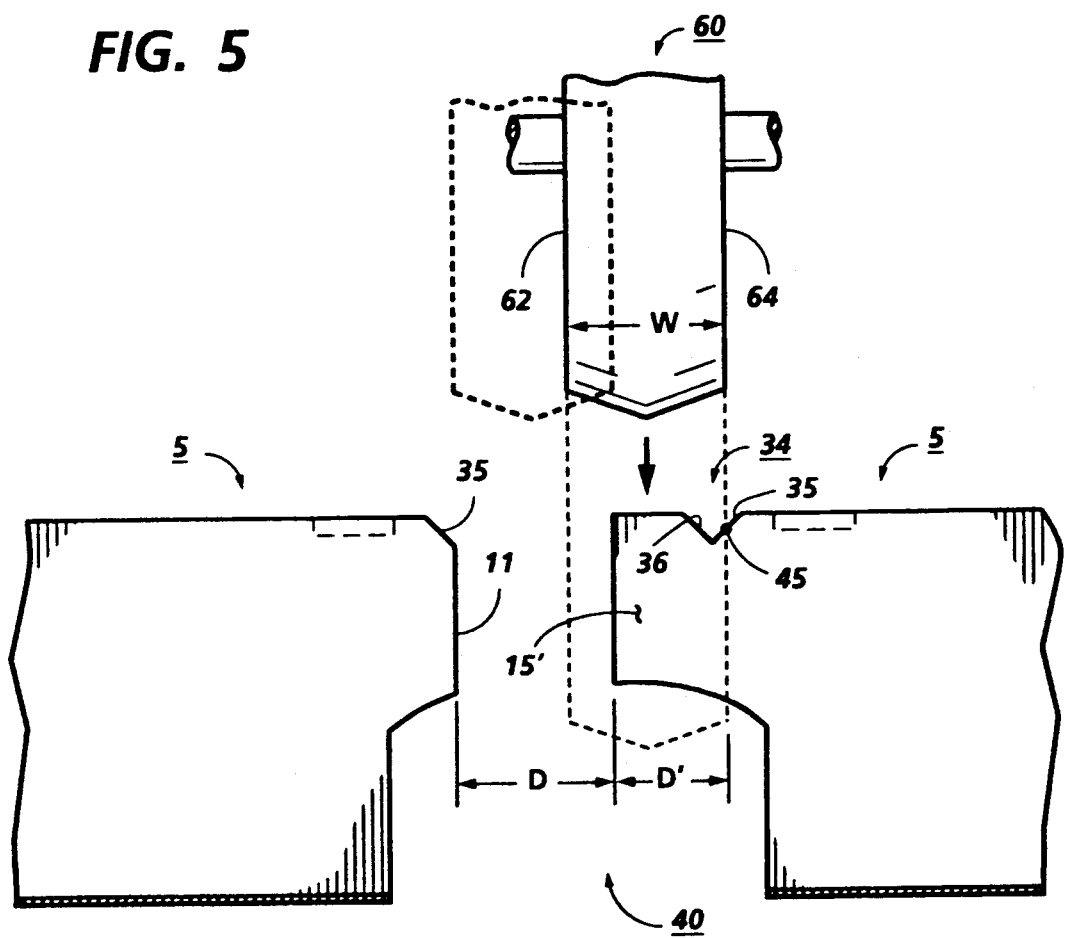
FIG. 5 is an enlarged side view in cross section depicting an alternate two-pass separation processing in which the tab formed between separation grooves is slightly wider than the width of the dicing blade to thereby enable a two-pass separation process but with a substantial reduction in the amount of silicon destroyed during the process.

In the FIG. 5 embodiment, where like numbers refer to like parts, the two-pass dicing process is retained while advantageously reducing the amount of silicon destroyed during the dicing process. In this embodiment, tabs 15 are slightly wider (D+D') than the width W of dicing blade 60. During the dicing process, one side, i.e., side 62 of blade 60, is aligned with the midpoint 45 of wall 35 of one groove, i.e., groove 33, and the cut made separating the dies adjoining that side from wafer 20. During cutting, blade 60 destroys the portion of the tabs 15 that are in the path of blade 60. As a result, a substantial section of the tabs equal in width to D is destroyed, leaving a relatively small pratial tab 15' having a width D' remaining.

Dicing blade 60 is then indexed by the distance D' in the directionof the remaining groove, i.e., groove 34, to align the edge 64 of blade 60 with the midpoint 45 of wall 35 of the groove and the cut made. The width W of blade 60 is larger than the width D' of partial tab 15' so that as a result, in this second cutting step, blade 60 obliterates the remainder 15' of the tabs 15.

In one example, the overal width D+D' of tabs 15 is 101 $\mu$m with the width D of blade 60 is 72 $\mu$m. Accordingly, during the first cut, the width D of tabs 15 that is destroyed is 72 $\mu$m, leaving a small tab 15' remaining having a width D' of 29 $\mu$m. Dicing blade is then indexed by a distance of 29 $\mu$m toward the second groove to align the opposite side of blade 60 with the midpoint 45 of the wall 35 of that groove and the second cut made to complete the separation.

While CCD type sensor dies are shown and described herein, other types of arrays, materials other than silicon, and other crystalline orientations may be contemplated. Further, while image scanning or reading dies are desccribed, image writing dies having, for example, one or more linear rows of selectively actuable LEDs, may be contemplated.

It is understood that other chemical etchants, other etching techniques such as plasma etching, etc., and/or use of materials with different crystalline orientation may result in groove shapes other than those shown and described herein. Further, that the order in which grooves 33, 34, 40 and lines 32 are formed may be changed from that described herein. And the order in which dies 5 are cut from wafer 20 may be changed by first cutting along lines 32 followed by cutting along grooves 33, 34. And, while grooves 33, 34 are described as being formed by etching, grooves 33, 34 may instead be formed by other suitable processes such as scribing, sand blasting, water jet cutting, laser cutting, etc. Similarly, forming wide grooves 40, cutting along lines 32, and/or cutting in grooves 33, 34 may be done by other suitable processes such as water jet cutting, laser cutting, etc. instead of by sawing.

Where two dimensional arrays are contemplated grooves 33, 34 may be formed along the long sides 6 of the dies as well in place of lines 32 and the dies separated from the wafer in the manner described. This provides precision faces on all four sides of the dies which enable the dies to be assembled side to side to form a two dimensional array, and end-to-end to provide a longer two dimensional array.

Further, the relative positions of wafer 20 and dicing blade 60 during the separation proces may be established by moving either wafer 20 or blade 60 or both.

While the invention has been described with reference to the structure disclosed, it is not confined to the details set forth, but is intended to cover such modifications or changes as may come within the scope of the following claims.

We claim:

1. A process for separating rows of sensor dies on a commoon wafer using a dicing blade to provide uniform, smooth die ends allowing the dies to be abutted at said ends to form a longer sensor array while reducing the amount of silicon lost during the separation process, said wafer having an active with sensor circuitry and an opposite inactive surface, comprising the steps of:
   a) forming pairs of parallel grooves in the active surface of said wafer between each of said rows of dies bordering the ends of the dies in said rows with said groove pairs being spaced apart by a distance at least equal to the cutting width of said blade to create a relatively small throwaway tab of silicon material therebetween;
   b) forming a single groove in the opposite surface of said wafer opposite to each of said groove pairs having a width slightly greater than the distance between said groove pairs;
   c) locating said blead and wafer relative to one another at one of said groove pairs with at least one edge of said blade aligned with substantially the midpoint of the wall of oone of the grooves of said groove pairs that borders the die ends of one of said rows;
   d) sawing said wafer through said tab with said blade to at least provide said precision die ends for said one row of dies;
   e) where the cutting width of said blade is less than said distance between groove pairs, locating said blade and wafer relative to one another so that the opposite edge of said blade is aligned with substantially the midpoint of the wall of the other groove of said one groove pair that borders the die ends of the next row of dies;
   f) sawing said wafer through the remaining part of said tab with said blade to provide said presision die ens for said next row of dies; and
   g) repeating steps c-g for the remaining ones of said groove pairs.

2. A process for separating rows of sensor dies on a common wafer using a dicing blade to provide uniform, smooth die ends allowing the dies to be abutted at said ends to form a longer sensor array while reducing the amount of silicon lost during the separation process, said wafer having an active surface with sensor circuitry and an opposite inactive surface, comprising the steps of:
   a) forming pairs of V grooves in said wafer active surface between each of said die rows with the interior walls of said groove pairs defining a throwaway center tab and the exterion of said groove pairs defining the die ends with the distance between said groove pairs being substantially equal to the cutting width of said dicing blade wherebyp to reduce the size of said tab to a minimum and reduce the amount of silicon thrown away;
   b) forming a single groove in said wafer inactive surface opposite each of said groove pairs having a width at least equal to said distance between said groove pairs;
   c) locating said blade opposite the tab between one of said die rows;
   d) aligning one edge of said blade with substantially the midpoint of the exterior wall of one of said grooves of the groove pair defining the tab of step c; and
   e) cutting said wafer at said tab with said blade to remove said tab and simultaneously provide said die ends for each of the rows of dies bordering said groove pairs.

3. The process according to claim 2 including the step of:
   repeating steps c-e for each of the remaining rows of said dies on said wafer.

4. A process for separating rows of sensor dies on a common wafer using a dicing blade to provide uniform, smmoth, precision die ends allowing the dies to be abuttd at said ends to form a longer sensor array while reducing the amount of silicon lost during the separation process, said wafer having an active surface with sensor circuitry and an opposite inactive surface, comprising the steps of:
   a) forming pairs of V grooves in said wafer active surface between each of said die rows with the interior walls of said groove pairs defining a throwaway center tab section and the exterior walls of said groove pairs defining the die ends with the distance between said groove pairs being slightly greater than the cutting wideth of said dicing blade whereby to reduce the size of said tab section to a minimum and reduce the amount of silicon thrown away;
   b) forming a single groove in said wafer inactive surface opposite each of said groove pairs having a width at least equal to said distance between said groove pairs;
   c) locating said blade opposite the tab section between one of said die rows with one edge of said blade aligned with substantailly the midpoint of the exterior wall of one of said grooves of one of said groove pair defining said tab section;
   d) cutting said wafer at said one groove with said blade to remove a portion of said tab section and provide said precision die ends fork a first row of said dies;
   e) indexing said blade by a distance equal to the remaineder of said tab section;
   f) aligning the opposite edge of said blade with the midpoint of the exterior wall of the other of said grooves of the groove pair defining said tab section; and
   g) cutting said wafer at said other groove with said blade to remove the remainder of said tab section and provide said precision die ends for a second row of dies.

5. The process according to claim 4 including the steps of:
   repeating steps c-g for each of the remaining rows of said dies on said wafer.

* * * * *